United States Patent [19]

Suzuki et al.

[11] Patent Number: 4,481,229

[45] Date of Patent: Nov. 6, 1984

[54] METHOD FOR GROWING SILICON-INCLUDING FILM BY EMPLOYING PLASMA DEPOSITION

[75] Inventors: Keizo Suzuki, Hachioji; Atsushi Hiraiwa, Kodaira; Shigeru Takahashi, Hachioji; Shigeru Nishimatsu, Kokubunji; Ken Ninomiya, Tokyo; Sadayuki Okudaira, Ome, all of Japan

[73] Assignee: Hitachi, Ltd., Tokyo, Japan

[21] Appl. No.: 505,719

[22] Filed: Jun. 20, 1983

[30] Foreign Application Priority Data

Jun. 25, 1982 [JP] Japan ................................. 57/108336

[51] Int. Cl.³ .............................................. B05D 3/06

[52] U.S. Cl. ........................................ 427/38; 427/47; 427/86; 427/95

[58] Field of Search ....................... 427/38, 47, 86, 95

Primary Examiner—Bernard D. Pianalto
Attorney, Agent, or Firm—Antonelli, Terry & Wands

[57] ABSTRACT

A method for growing a silicon-including film is disclosed in which the above film is grown on a surface of a substrate by using, as a discharge gas, a halogenide silicon gas or a gas mixture containing a halogenide silicon gas in a plasma deposition apparatus including a vacuum chamber, means for supplying microwave power to the vacuum chamber, means for forming a magnetic field in at least part of the vacuum chamber, means for introducing the discharge gas into the vacuum chamber, and means for holding the substrate within the vacuum chamber.

15 Claims, 5 Drawing Figures

METHOD FOR GROWING SILICON-INCLUDING FILM BY EMPLOYING PLASMA DEPOSITION

BACKGROUND OF THE INVENTION

The present invention relates to a method for growing a thin film by using a plasma deposition apparatus, and more particularly to a film production method suited to grow a silicon-including film, that is, a film containing silicon as a single constituent element or one of constituent elements, such as a monocrystalline silicon film, polycrystalline silicon film, amorphous silicon film, silicide film including silicon oxide film, silicon nitride film, and silicon carbide film, etc. The term "silicide" will mean binary compounds of silicon and another element.

Vapor phase film production methods of various kinds have been known which include the CVD method (namely, chemical vapor deposition method), sputtering method, plasma CVD method, and others. Specifically, the plasma CVD method has advantages that the operation (or treatment) temperature is low and the film production rate (namely, film deposition rate) is large, and therefore will be positively employed in a process for fabricating a semiconductor device.

In the above fabricating process, the plasma CVD method is applied mainly to the production of a silicon-including film, and is important particularly in the following cases.

(A) A silicon nitride (Si—N) film is produced to be used as a passivation (or protection) film of a semiconductor device.

(B) An amorphous silicon (a—Si) film is produced to form a solar cell.

In the case where a thin film is grown by the plasma CVD method, an apparatus for growing the film is required to have (1) a plasma generation part (including an evacuation system), (2) a gas introduction part (for introducing into the plasma generation part a gas containing silicon as at least one constituent element), and (3) a substrate holding part (namely, a substrate stage).

In conventional plasma CVD apparatuses, D.C. (direct current) glow discharge or RF (radio frequency) discharge having a frequency f which lies in a range from tens of kilohertz to tens of megahertz, is used to produce the plasma.

FIG. 1 is a schematic view showing the structure of a plasma CVD apparatus of D.C. glow discharge type. In FIG. 1, reference numeral 1 designates a vacuum chamber, 2 electrodes, 3 a D.C. power supply, 4 a substrate stage, 5 a substrate, 6 a discharge-gas introducing leak valve, and 7 a plasma.

Referring to FIG. 1, a discharge gas is introduced into the vacuum chamber 1 through the leak valve 6, and then a voltage from the power supply 3 causes discharge between the electrodes 2. Thus, a thin film is grown on a surface of the substrate 5 by active species (namely, active particles) produced in the discharge.

FIG. 2 is a schematic view showing the structure of a plasma CVD apparatus of RF discharge type. In FIG. 2, the same reference numerals as in FIG. 1 designate identical or equivalent parts. Further, reference numeral 8 designates a capacitor, and 9 an RF power supply. The apparatus shown in FIG. 2 is different from that shown in FIG. 1 in that a high-frequency power supply, that is, the RF power supply is used in place of the D.C. power supply.

The growth of a film using the conventional plasma CVD apparatuses can be made only under limited operating conditions, since the apparatuses have the following drawbacks.

(a) A gas pressure, at hwich discharge can be generated, usually lies in a range from $10^{-2}$ to $10^{-1}$ Torr, and it is difficult to deposit a film at pressures less than $10^{-2}$ Torr.

(b) In the apparatus of RF discharge type (shown in FIG. 2), an ion sheath is formed in front of the substrate, and thus the substrate is automatically applied with a self-bias voltage $V_{sb}$ when viewed from the plasma. As a result, ions incident upon the substrate have a kinetic energy corresponding to the self-bias voltage, that is, an energy of hundreds of electron volt or more. It is difficult to make the incident energy of ions less than the above value. The characteristic of a deposited film is readily affected by the bombardment of ions having such a large kinetic energy, and therefore the conventional apparatus which cannot make small the kinetic energy of incident ions, is disadvantageous.

(c) When a film is grown in each of the conventional apparatuses shown in FIGS. 1 and 2, an electrode material (namely, a metal) is sputtered since it is kept in contact with the plasma, and the material thus sputtered is contained in a deposited film as a contaminating material, which has an adverse effect on optical properties of the deposited film.

Further, there arise problems other than the above drawbacks. For example, in the case where a silicon-including film e.g. a silicide film is grown with the conventional apparatuses, SiH$_4$ serving as a silicon-supplying gas is used as a discharge gas or part thereof. That is, in the case where an Si—N film is grown, a gas mixture containing SiH$_4$, N$_2$ and Ar is usually employed. (Refer to a book entitled "Semiconductor Plasma Process Technology" edited by Takuo Sugano and published by Sangyo Tosho, 1980, pages 238 to 242). Further, in the case where an a—Si film is grown, a gas mixture containing SiH$_4$ and Ar is usually employed as described in a Japanese article entitled "Amorphous Silicon Solar Cell" by Yoshihiro Hamakawa ("Kotai Butsuri" Vol. 14, No. 10, 1979, pages 641 to 651).

However, when SiH$_4$ is used as a silicon-supplying gas, hydrogen is contained in the deposited film, and thus there arise the following problems.

(a) In an Si—N film used as a protection film, impurity hydrogen atoms decompose to migrate into a semiconductor element, and thus the characteristic of the element is degraded, as described in an article entitled "Threshold-voltage Instability in MOSFET's Due to Channel Hot-hole Emission" by R.B. Fair et al. (IEEE, ED-28, 1981, pages 83 to 94).

(b) In an a—Si film, hydrogen atoms having saturated dangling bonds may dissociate at elevated temperatures higher than 300° C., and desorb from the film. Thus, the density of localized energy states is increased.

In order to grow a silicide or silicon-including film which does not contain hydrogen, a halogenide silicon gas, for example, SiF$_4$, SiCl$_4$, SiFCl$_3$, SiF$_3$Cl, SiBr$_4$, or the like is used as the silicon-supplying gas, in place of SiH$_4$. However, when the halogenide silicon gas is used as the silicon-supplying gas in the conventional apparatuses shown in FIGS. 1 and 2, a desired film is not deposited on the surface of the substrate, but a silicon wafer used as the substrate is etched. Two main reasons why the film is not deposited are as follows.

(A) In these apparatuses, an operating gas pressure higher than $10^{-2}$ Torr is used, and therefore the electron temperature of discharge is low, that is, about 4 eV. On the other hand, the bonding energy Q of a halogenide silicon gas (for example, $Q_{Si-F}$ equal to 115 kcal/mol or $Q_{Si-Cl}$ equal to 67.8 kcal/mol) is greater than that of SiH4 (namely, $Q_{Si-H}$ equal to 53.7 kcal/mol) (see JANAF, "Thermochemical Tables", Dow Chemical Co., Midland; Mich.). Accordingly, it is impossible to fully decompose the halogenide silicon gas by the discharge generated in the conventional apparatuses, and therefore a silicon-including film is not grown.

(B) Further, in the conventional apparatus shown in FIG. 2, the energy of ions incident upon the surface of the substrate is large, and therefore a film deposited on the substrate surface is sputtered or decomposed by the incident ions. Thus, the film is prevented from growing.

As can be seen from the above explanation, in order to grow a silicon-including film which is free from hydrogen, a plasma CVD apparatus is required which generates discharge having a high electron temperature and can decrease the energy of ions incident upon the substrate surface. Further, a plasma CVD apparatus in which each of the operating gas pressure, the electron temperature of discharge and the energy of ions incident upon the substrate surface can be varied in a wide range, is very useful for the production of the above film.

SUMMARY OF THE INVENTION

It is accordingly an object of the present invention to provide a method for growing a silicon-including film which is free from hydrogen.

In order to attain the above object, according to the present invention, there is provided a method for growing a film through a plasma deposition technique, in which a film containing silicon as at least one constituent element of the film is grown on a substrate by using, as a discharge gas, one of a halogenide silicon gas and a gas mixture containing a halogenide silicon gas in a plasma deposition apparatus including a vacuum chamber, means for supplying microwave power to the vacuum chamber, means for forming a magnetic field in at least part of the vacuum chamber, means for introducing the discharge gas into the vacuum chamber, and means for holding the substrate within the vacuum chamber.

According to the above method of the present invention, a silicon-including film which does not contain hydrogen can be grown, and thus a film suitable for a solar cell and a film suited to be used as a protection film of a semiconductor device can be obtained.

DESCRIPTION OF THE PREFERRED EMBODIMENT

Figure 1:
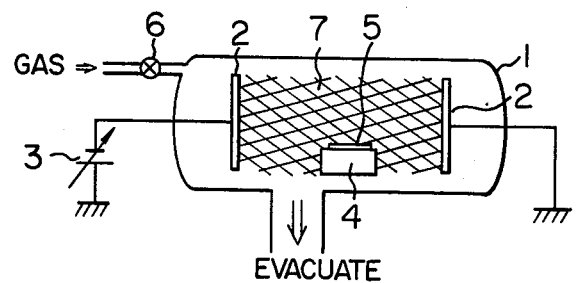
FIG. 1 is a schematic view showing the structure of a plasma CVD apparatus of D.C. glow discharge type.
Figure 2:
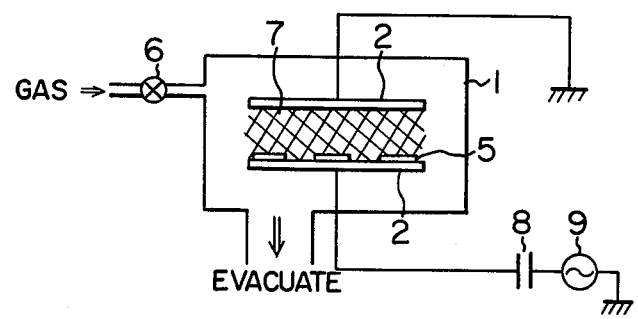
FIG. 2 is a schematic view showing the structure of a plasma CVD apparatus of RF discharge type.
Figure 3:
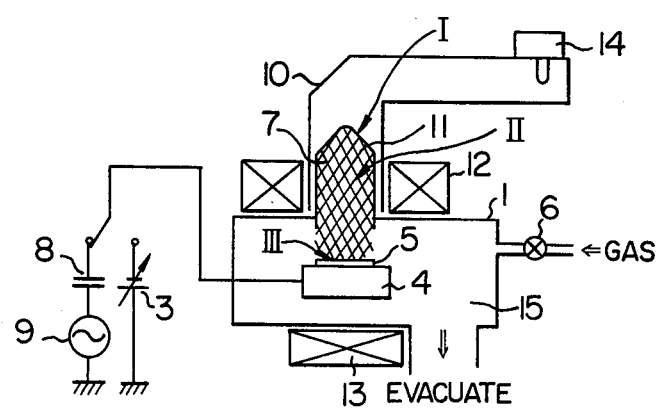
FIG. 3 is a schematic view showing the structure of a plasma deposition apparatus of microwave discharge type used in a film production method according to the present invention.

FIG. 3 is a schematic view showing the structure of a plasma deposition apparatus of microwave discharge type used in a film production method according to the present invention. In FIG. 3, the same reference numerals as in FIGS. 1 and 2 designate identical or similar parts. Further, reference numeral 10 designates a round waveguide acting as means for microwave introduction, 11 a discharge tube, 12 a solenoid coil for forming a magnetic field in a vacuum chamber 1, 13 a permanent magnet, 14 a microwave generating part, and 15 a substrate chamber. A vacuum chamber 1 includes the substrate chamber 15 and the inside of the discharge tube 11.

A microwave (usually having a frequency of 0.1 to 10 GHz) is generated by, for example, a magnetron, and led to the discharge tube 11 through the round waveguide 10. The waveguide 10 may be replaced by a coaxial waveguide or a Lisitano coil which is described in, for example, J. Vac. Sci. Technol., 17(5), pages 1247 to 1251, Sept./Oct. 1980. The discharge tube 11 is made of an insulator capable of transmitting the microwave (for example, quartz, alumina or others). A plurality of gas inlets (namely, leak valves 6) are provided to obtain a uniform deposition rate over a substrate surface. A magnetic field is established in at least part of the vacuum chamber (for example, in the discharge tube) by an electromagnet, permanent magnet, or a combination thereof so that a desired distribution of magnetic field and a desired strength of magnetic field (namely, a desired magnetic flux density) are obtained.

When a discharge gas is introduced into the vacuum chamber to a predetermined pressure and microwave power is supplied to the discharge tube, microwave discharge is generated under the superposed influence of the magnetic field and microwave electric field. Microwave power is mainly absorbed by electrons.

Now, explanation will be made on how the magnetic field is to be formed.

An electron makes a cyclotron motion around a line of magnetic force, and a cyclotron frequency $f_{cl}$ of electron is given by the following equation:

$$f_{ce} \text{ (in Hz)} = Be/2\pi\, m$$

where B indicates a magnetic flux density (in T), m electron mass (in kg), and e electron charge (in Coulomb).

When the cyclotron frequency $f_{ce}$ is made equal to a microwave frequency $f_{mw}$, the cyclotron motion of electron resonates with the microwave electric field. Microwave power can be efficiently transmitted into a plasma by utilizing the above resonance. However, in order to improve the absorption efficiency of microwave power by plasma and to increase a plasma density around the substrate surface, it is necessary to take into consideration the following points.

(1) When the cyclotron frequency $f_{ce}$ is made exactly equal to the microwave frequency $f_{mw}$, that is, an electron cyclotron resonance condition (namely, ECR condition) is satisfied, the microwave cannnot be propagated deep into the plasma, but is subjected to perfect reflection. Accordingly, in order to efficiently transmit microwave power into the plasma, it is necessary to take an off-resonance condition, that is, it is required that the cyclotron frequency $f_{ce}$ is not exactly equal to the microwave frequency $f_{mw}$ but nearly equal to $f_{mw}$.

(2) The plasma generated by the action of the microwave electric field and the magnetic field extends from a region where the strength of magnetic field is high, to a region where the strength of magnetic field is low, on the basis of Lorentz force. Accordingly, it is desirable that, in the discharge tube, the strength of magnetic field has a tendency to decrease along a direction toward the substrate surface (namely, a direction from the upper portion of the discharge tube 11 to the substrate 5 in FIG. 3).

(3) In order to focus the plasma which has been generated in the discharge tube and then transferred along lines of magnetic force, on the substrate surface, the lines of magnetic force are required to gather together at the substrate surface (that is, the strength of magnetic field is required to increase at the substrate surface). The permanent magnet 13 serves to gather the lines of magnetic force together at the substrate surface.

Figure 4:
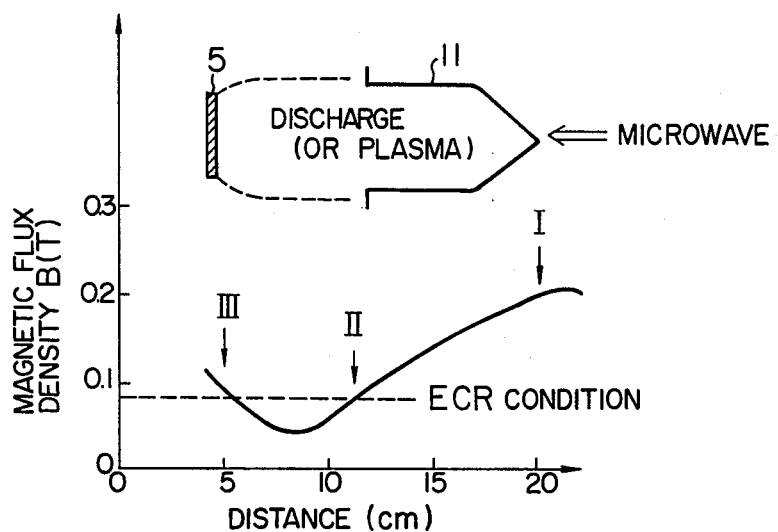
FIG. 4 is a graph showing an actual example of the distribution of magnetic flux density in the apparatus shown in FIG. 3.

From the above items (1), (2) and (3), it is known that a distribution of magnetic flux density such as shown in FIG. 4 is desirable. FIG. 4 shows an actual example of magnetic flux density distribution, together with respective positions of the discharge tube 11 and substrate 5. Referring to FIG. 4, the magnetic flux density is larger than a value $B_{ce}$ satisfying an ECR condition, at the uppermost position I of the discharge tube, and decreases gradually toward the substrate to satisfy the ECR condition at an intermediate position II. The magnetic flux density having decreased as above further decreases to a minimum value and then increases. Thus, the flux density again takes the value $B_{ce}$ at a position III proximate to the substrate surface. The above distribution of magnetic flux density produces the so-called mirror type magnetic field. Such a mirror type magnetic field can be obtained, for example, by distributing the strength of magnetic field in a range from $5 \times 10^{-2}$ to $5 \times 10^{-1}$ T by the use of a plurality of magnetic field forming means, when a microwave frequency $f_{mw}$ of 2.45 GHz is used.

Referring back to FIG. 3, the substrate 5 can be applied with an external voltage by means of a D.C. power supply 3 or an RF power supply 9. In the plasma deposition apparatus used in the present invention, the energy of ions incident upon the substrate surface is low, (that is, about 20 eV) when no external voltage is applied to the substrate. Accordingly, an external voltage is applied to the substrate at need, and thus the kinetic energy of incident ions can be widely varied in a range greater than 20 eV. That is, the characteristic of deposited film can be changed by controlling the kinetic energy of ions incident upon the substrate surface. On the other hand, in the conventional plasma CVD apparatus of RF discharge type, it is impossible to make the kinetic energy of incident ions less than hundreds of electron volt.

Next, a method for growing a silicon-including film according to the present invention which makes use of the above plasma deposition apparatus, will be explained below, on the basis of embodiments thereof.

PRODUCTION OF SI—N FILM

A gas mixture containing $SiF_4$ and $N_2$ in a ratio 1:1 is used as a discharge gas. In this case; $SiF_4$ serves as a silicon-supplying gas and $N_2$ as a nitrogen-supplying gas. A microwave having a frequency of 2.45 GHz is used, and 200 W of microwave power is supplied to the discharge tube. The above discharge gas is introduced into the vacuum chamber 1 to a pressure of $8 \times 10^{-4}$ Torr. A magnetic flux density distribution such as shown in FIG. 4 is formed in the vacuum chamber. Microwave discharge is generated under these conditions, and an Si—N film is grown in the state that no external voltage is applied to the substrate. In this case, the film is grown at a deposition rate of about 100 nm/min, and the film thus grown has a refractive index of 2.0 at the wavelength 5461A. This value agrees with the refractive index of a pure $Si_3N_4$ film. Further, it is needless to say that the above film is free from hydrogen. Thus, a protection film, which is excellent in corrosion resistance, hardness, and closeness (or density), for a semiconductor element is obtained. Further, the nitrogen-supplying gas is not limited to $N_2$, but may be a nitrogen-containing gas (for example, $NF_3$ or others).

Figure 5:
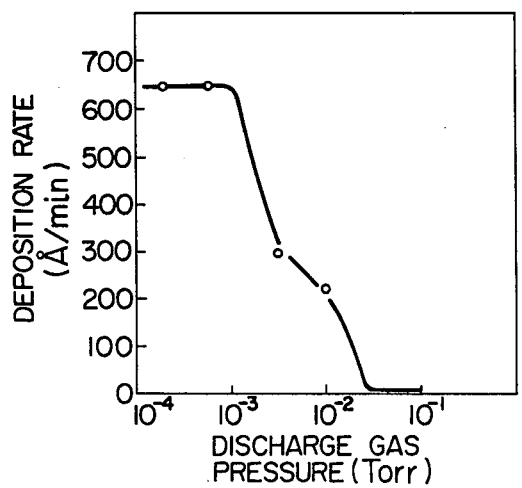
FIG. 5 is a graph showing a relation between discharge gas pressure and deposition rate in the case where an Si—N film is grown by a film production method according to the present invention.

FIG. 5 is a graph showing a relation between discharge gas pressure and deposition rate in the case where an Si—N film is grown according to the present invention. The experimental conditions for obtaining the relation are similar to those in the above embodiment. That is, in the experiments for obtaining the relation shown in FIG. 5, the gas mixture containing $SiF_4$ and $N_2$ in a ratio of 1:1 is used as the discharge gas, 200 W of microwave power is supplied to the discharge tube, and the substrate is supplied with no external voltage.

As is apparent from FIG. 5, the deposition rate is large in a low gas pressure region where the electron temperature of discharge is high, and decreases greatly as the gas pressure becomes higher and the electron temperature is made lower. Therefore, it is desirable from the practical point of view to make the discharge gas pressure less than $3 \times 10^{-2}$ Torr.

Further, other experiments have been made in which the discharge gas pressure is made very low, and it has been known that the microwave discharge is hard to occur in a pressure range lower than $5 \times 10^{-5}$ Torr and such a pressure range is not practical.

PRODUCTION OF A—SI FILM

In this case, $SiF_4$ is used as the discharge gas, and the microwave frequency, applied microwave power, discharge gas pressure and magnetic flux density distribution are similar to those in growing the Si—N film. The film thus grown is small in the number of localized states, and therefore exhibits an excellent characteristic when used as a solar cell.

As mentioned above, a silicon-including film which is free from hydrogen, can be grown by using $SiF_4$ as a silicon-supplying gas.

Although the growth of a silicon-including film by the use of $SiF_4$ or a gas mixture containing $SiF_4$ cannot be made with the conventional plasma CVD apparatuses, it becomes possible according to the present invention for the following reasons.

(A) The microwave discharge used in the present invention is higher in electron temperature than the D.C. glow discharge and RF discharge generated in the conventional plasma CVD apparatuses. That is, the microwave discharge has a high electron temperature (about 8 eV) in a pressure range lower than $10^{-2}$ Torr. Therefore, $SiF_4$ which is larger in bonding energy than $SiH_4$, can be well decomposed by the microwave discharge, and thus a silicon-including film can be grown.

(B) When the substrate is applied with no external voltage, the energy of ions incident upon the substrate surface is low, that is, about 20 eV. Accordingly, the incident ions are hard to sputter or decompose a film deposited on the substrate surface, and therefore the film is easy to grow.

In the above embodiments is shown the case where a discharge gas contains $SiF_4$. However, it is needless to say that, according to the present invention, a silicon-including film which is free from hydrogen, can be grown by using a different halogenide silicon gas, for example, $SiCl_4$, $SiF_nCl_m$ (where $n+m=4$) or $Si_xF_yCl_z$ ($x \geq 2$) in place of $SiF_4$.

Next, fundamental features of the plasma deposition apparatus of microwave discharge type which is used in the present invention, will be listed below.

(a) The above film can be grown in a range of discharge gas pressure from $5 \times 10^{-5}$ to 10 Torr, and the electron temperature of discharge is changed from about 8 eV in a low gas pressure region less than $10^{-2}$ Torr to about 4 eV in a high gas pressure region more than $10^{-2}$ Torr.

(b) The potential, $V_{sb}$, of the substrate viewed from the plasma is very low, that is about $-20$ V. Therefore, the kinetic energy of ions incident upon the substrate can be varied in a range from 20 to hundreds of electron volt, by superposing an external voltage from the D.C. power supply or RF power supply on the above bias voltage.

(c) The microwave discharge is essentially a kind of discharge with no electrodes. Accordingly, all portions kept in contact with the plasma such as the discharge tube, the inner wall of the apparatus and the substrate stage can be made of or coated with a material having no adverse effect on the properties of a deposited film.

As has been explained in the foregoing, according to the present invention, a film having an excellent characteristic which cannot be obtained with the conventional apparatuses, can be grown by using a plasma deposition apparatus of microwave discharge type. Particularly, a silicon-including film free from hydrogen can be grown by using, as a discharge gas, a halogenide silicon gas such as $SiF_4$ or $SiCl_4$ or a gas mixture containing the halogenide silicon gas. Thus, a silicon-including film suited for a solar cell or a protection film of a semiconductor device can be obtained.

We claim:

1. A method for growing a silicon-including film comprising the steps of:
    holding a substrate within a vacuum chamber;
    forming a magnetic field in said vacuum chamber;
    introducing, as a discharge gas, one of a hydrogen-free halogenide silicon gas or a gas mixture containing a hydrogen-free halogenide silicon gas in said vacuum chamber; and
    supplying a microwave power to said vacuum chamber to form a plasma and deposit a silicon-including film by plasma deposition, whereby a hydrogen-free silicon-containing film can be grown on said substrate.

2. A method for growing a silicon-including film through a plasma deposition technique, according to claim 1, wherein said halogenide silicon gas is one of $SiF_4$ and $SiCl_4$.

3. A method for growing a silicon-including film through a plasma deposition technique according to claim 2, wherein the magnetic field is formed such that, when viewed along the propagation path of a microwave, the strength of the magnetic field formed in said vacuum chamber is larger than a value satisfying an electron cyclotron resonance condition, at that portion of a plasma where microwave power is propagated from atmospheric pressure region to vacuum region, and decreases gradually along said propagation path to satisfy said electron cyclotron resonance condition in the course of said propagation path.

4. A method for growing a silicon-including film according to claim 2, wherein said method further comprises a step of controlling a kinetic energy of incident ions in a range of 20 eV to hundreds of eV by applying an external voltage to said substrate.

5. A method for growing a silicon-including film through a plasma deposition technique according to claim 1, wherein the pressure of said discharge gas is put in a range from $5 \times 10^{-5}$ to $3 \times 10^{-2}$ Torr when microwave discharge is generated.

6. A method for growing a silicon-including film through a plasma deposition technique according to claim 5, wherein the magnetic field is formed such that, when viewed along the propagation path of a microwave, the strength of the magnetic field formed in said vacuum chamber is larger than a value satisfying an electron cyclotron resonance condition, at that portion of a plasma where microwave power is propagated from atmospheric pressure region to vacuum region, and decreases gradually along said propagation path to satisfy said electron cyclotron resonance condition in the course of said propagation path.

7. A method for growing a silicon-including film according to claim 5, wherein said halogenide silicon gas is one of $SiF_4$ and $SiCl_4$.

8. A method for growing a silicon-including film through a plasma deposition technique according to claim 7, wherein the magnetic field is formed such that, when viewed along the propagation path of a microwave, the strength of the magnetic field formed in said vacuum chamber is larger than a value satisfying an electron cyclotron resonance condition, at that portion of a plasma where microwave power is propagated from atmospheric pressure region to a vacuum region, and decreases gradually along said propagation path to satisfy said electron cyclotron resonance condition in the course of said propagation path.

9. A method for growing a silicon-including film according to claim 7, wherein said method further comprises a step of controlling a kinetic energy of incident ions in a range of 20 eV to hundreds of eV by applying an external voltage to said substrate.

10. A method for growing a silicon-including film through a plasma deposition technique according to claim 1, wherein the magnetic field is formed such that, when viewed along the propagation path of a microwave, the strength of the magnetic field formed in said vacuum chamber is larger than a value satisfying an electron cyclotron resonance condition, at that portion of a plasma where microwave power is propagated from atmospheric pressure region to vacuum region, and decreases gradually along said propagation path to satisfy said electron cyclotron resonance condition in the course of said propagation path.

11. A method for growing a silicon-including film according to claim 1, wherein said method further comprises a step of controlling a kinetic energy of incident ions in a range of 20 eV to hundreds of eV by applying an external voltage to said substrate.

12. A method for growing a silicon-including film according to claim 1, wherein said discharge gas is a gas mixture containing a silicon-supplying gas and a nitrogen-supplying gas, whereby a silicon nitride film free of hydrogen can be grown on the substrate.

13. A method for growing a silicon-including film according to claim 12, wherein said silicon-supplying gas is $SiF_4$ and said nitrogen-supplying gas is $N_2$.

14. A method for growing a silicon-including film according to claim 1, wherein said discharge gas is $SiF_4$, whereby an amorphous silicon film free of hydrogen can be grown on the substrate.

15. A method for growing a silicon-including film according to claim 1, further comprising applying a magnetic field at the substrate surface to gather together the lines of magnetic force, of the magnetic field formed in the vacuum chamber, at the substrate surface.

* * * * *